United States Patent [19]

Sugie

[11] 4,100,463
[45] Jul. 11, 1978

[54] MAGNETRON, POWER SUPPLY, AND FAN INTEGRAL ASSEMBLY

[75] Inventor: Jiro Sugie, Mobara, Japan

[73] Assignee: Hitachi, Ltd., Tokyo, Japan

[21] Appl. No.: 718,829

[22] Filed: Aug. 30, 1976

[30] Foreign Application Priority Data

Nov. 5, 1975 [JP] Japan .............................. 50-132145
Nov. 7, 1975 [JP] Japan .............................. 50-133083

[51] Int. Cl.² ................................................ H05B 37/00
[52] U.S. Cl. ............................. 315/205; 219/10.55 R;
219/10.55 C; 315/39.51; 315/85
[58] Field of Search ................ 315/39.51, 205, 206,
315/105, 39.53, 85; 219/10.55 R, 10.55 C, 10.55 D

[56] References Cited

U.S. PATENT DOCUMENTS

| 3,302,060 | 1/1967 | Blok et al. ............................ 315/307 |
| 3,304,400 | 2/1967 | Ojelid .............................. 315/39.53 X |
| 3,377,562 | 4/1968 | Staats ................................. 315/39.51 |
| 3,392,309 | 7/1968 | Hickman ............................... 315/94 |
| 3,789,263 | 1/1974 | Fritz et al. ......................... 315/39.51 |
| 3,924,196 | 12/1975 | Takahashi et al. ................. 315/39.51 |
| 3,973,165 | 8/1976 | Hester ................................. 315/105 |

*Primary Examiner*—Saxfield Chatmon, Jr.
*Attorney, Agent, or Firm*—Charles E. Pfund

[57] ABSTRACT

A magnetron oscillator, a source circuit for energizing the magnetron oscillator and a fan are contained in independent casing units and the casing units are removably connected together into an integral assembly such that the fan circulates cooling air through the source unit and the magnetron oscillator unit.

15 Claims, 7 Drawing Figures

MAGNETRON, POWER SUPPLY, AND FAN INTEGRAL ASSEMBLY

BACKGROUND OF THE INVENTION

This invention relates to magnetron apparatus for use in microwave ovens, defreezers, radars or the like.

Magnetron apparatus generates microwaves at high efficiencies so that it is used in various fields of application.

Generally, magnetrons, source devices fans, etc. are manufactured and assembled in different factories. A magnetron oscillator generally comprises an anode cylinder, a plurality of vanes extending from the inner wall of the anode cylinder toward the center thereof, a cathode electrode positioned at the center of the anode cylinder, permanent magnets for passing magnetic flux in the axial direction of the anode cylinder through an interaction space defined by the cathode electrode and the vanes, and an antenna for deriving out a microwave output from the magnetron. Thus, the magnetron oscillator is manufactured and sold as one unit like a vacuum tube, a transistor or the like. Accordingly, the maker of magnetron apparatus selects a magnetron oscillator having desired characteristics suitable for a particular application. For this reason, the maker of the magnetron apparatus is obliged to change the design of its apparatus to suit the characteristics of the magnetron oscillators available on the mark. On the other hand, the maker of the magnetron oscillators are required to manufacture magnetron oscillators of many types by the request of various makers of magnetron apparatus. Accordingly, it is the present practice that the makers of the magnetron oscillators manufacture oscillators for general use and that the makers of the magnetron apparatus modify their design to match its characteristics to those of the magnetron oscillators. The compromise described above between the makers of the magnetron oscillators and the apparatus utilizing the same imposes strict condition to the makers of the magnetron oscillators, i.e., the electric characteristics, efficiency, structural limits, etc. Accordingly, the makers of the magnetron oscillators are required to manufacture their magnetron oscillators and the component parts thereof at considerably high accuracies so that cost reduction of the product has been difficult. For the same reason, limits have been imposed upon the characteristics of the devices manufactured by the apparatus makers such as the capacity of the capacitance, the voltage-current characteristic of the boost transformer that constitute the source circuit of the magnetron oscillator.

Further, a magnetron oscillator is generally incorporated with a filter which is used to eliminate undesirable waves from transmitting to the outside from the filament terminals, and such filter has also been manufactured by the maker of the magnetron oscillator. Such magnetron oscillator is disclosed in U.S. Pat. No. 3,846,667 to Hisada et al, dated Nov. 5, 1974.

A source circuit including a transformer for applying high voltage to the anode electrode of the magnetron, a rectifier, etc. has been assembled and combined with a magnetron oscillator by the apparatus maker. A fan sending cooling air to the heat radiating fins of the magnetron has also been combined with a magnetron oscillator by the apparatus maker.

As above described a magnetron apparatus is fabricated from a number of component parts so that when the maker of the magnetron oscillator tries to combine a source circuit and a fan with a magnetron oscillator a long wiring may be required between the oscillator and the source circuit since it is often necessary to change the layout of the component parts. Further, since the fan must be located near the magnetron, it is necessary to use a special support for the fan. Moreover, since the fan and the source circuit are manufactured as independent units from the magnetron oscillator, they require additional spaces in the assembled magnetron appartus. The source circuit comprises compound parts generating considerable amount of heat such as a high voltage transformer and capacitor and these component parts are designed to be cooled by natural cooling so that these component parts operate at relatively high temperatures which greatly affect the operating characteristics of other electric elements.

SUMMARY OF THE INVENTION

Accordingly, it is an object of this invention to provide improved magnetron apparatus capable of alleviating various conditions which are imposed upon the apparatus when it is combined with other component parts and capable of decreasing the size and weight of the apparatus.

Another object of this invention is to provide a novel magnetron apparatus in which a single fan is used to cool not only the magnetron but also the source circuit and other elements thereby limiting the heating of the apparatus.

Still another object of this invention is to provide an improved magnetron apparatus capable of reducing the space occupied by the source circuit thereby decreasing the size and the weight of the apparatus.

A further object of this invention is to provide a novel magnetron apparatus wherein various component elements are prefabricated as units as far as possible thereby simplifying the assembling steps as well as maintenance.

According to this invention, there is provided magnetron apparatus comprising a magnetron oscillator unit for generating a microwave, a source unit containing a source circuit for operating the magnetron oscillator unit, a fan unit for circulating cooling air through the magnetron unit and the source unit, and means for connecting together the units into an integral assembly.

These units are combined such that the magnetron oscillator unit is mounted on the source unit, and the fan unit is connected to one side of the assembly of the source unit and the magnetron oscillator unit.

Alternatively, the magnetron oscillator unit, the source unit and the fan unit are superposed one upon the other in the axial direction of the magnetron oscillator.

DESCRIPTION OF THE PREFERRED EMBODIMENTS

Figure 1:
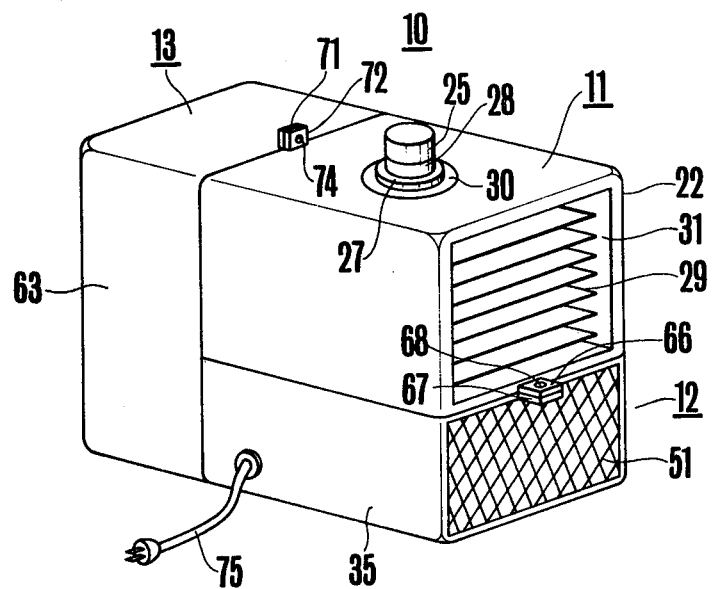
FIG. 1 is a perspective general view of one embodiment of the magnetron apparatus embodying the invention.

A preferred embodiment of the magnetron apparatus 10 embodying the invention comprises a magnetron oscillator unit 11, a source unit 12 for supplying an operating power to the magnetron oscillator unit 11, and a fan unit 13 for circulating cooling air through the magnetron oscillator unit 11 and the source unit 12. The magnetron oscillator unit 11 has a well known construction and comprises an anode cylinder 21, a plurality of vanes, not shown, extending from the inner wall of the anode cylinder toward the axis thereof, a cathode electrode, not shown, disposed at the center of the anode cylinder, a pair of permanent magnets 23 and 24 and a magnetic yoke 22 for passing magnetic flux in the axial direction of the anode cylinder through an interaction space defined by the vanes and the cathode electrode, an antenna 25, a metal cylinder 27 and an insulating number 28 which are disposed between the anode cylinder 21 and the antenna 25, a plurality of heat radiating fins 29 secured to the outer periphery of the anode cylinder 21 and extending in a direction perpendicular to the axis of the anode cylinder, and a gasket 30 between the yoke 22 and the metal cylinder 27. The magnet yoke 22 is used to also act as the casing of the magnetron oscillator and takes the form of a cubic box provided with opposing side openings 31 and 32.

Figure 3:
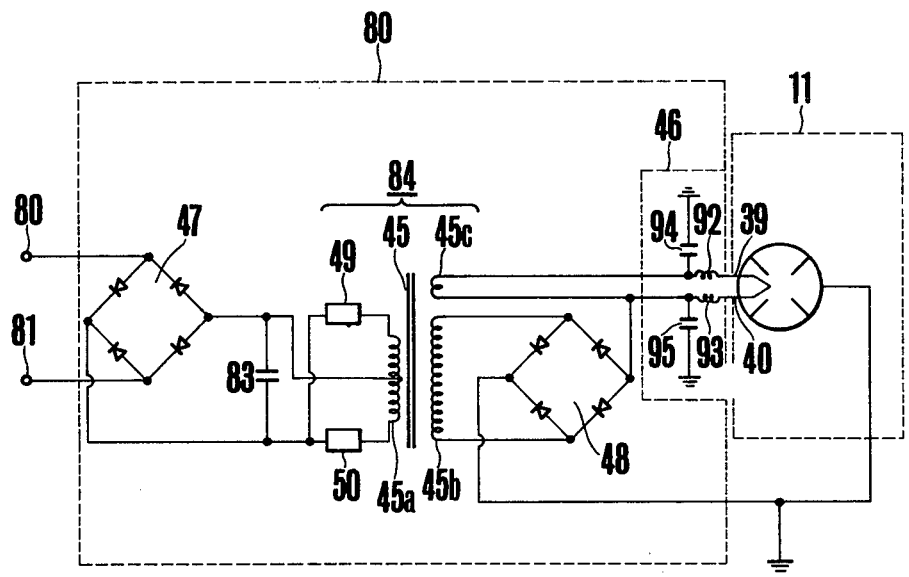
FIG. 3 is a connection diagram showing the source circuit employed in the magnetron device shown in FIG. 1.
Figure 4:
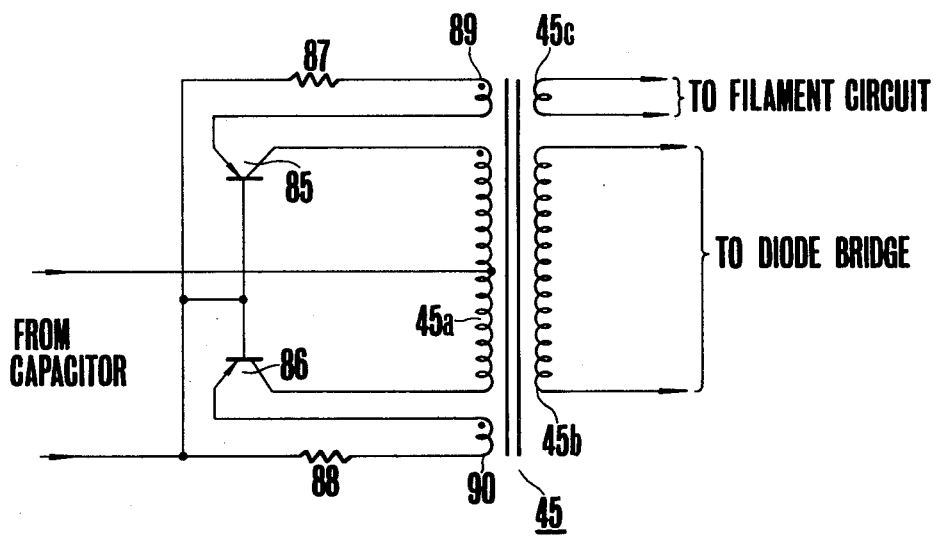
FIG. 4 is a connection diagram showing one example of the invention shown in FIG. 3.

The source unit 12 disposed beneath the magnetron oscillator unit 11 contains various circuit elements required to operate the magnetron oscillator unit. The metal casing of the source unit 12 also takes the form of a cubic box having the same upper area as the bottom area of the yoke and is provided with opposed side openings 36 and 37 on the same sides as the openings 31 and 32 of the yoke. A portion of the cathode supporting stem 38 extends into the casing 35 from the magnetron oscillator unit 11 and filament terminals 39 and 40 project downwardly from the lower end of the cathode supporting stem 38. Various component elements of the source circuit such as a transformer 45, a filter circuit 46, diode bridge circuits 47 and 48, switching elements 49 and 50 are mounted on the bottom of the casing 35. A typical example of the source circuit is shown in FIGS. 3 and 4 to be described later. A metal wire net 51 is fitted to the opening 36 of the casing for preventing undesired electric wave radiated from the filament terminals 39 and 40 from leaking to the outside. The size of the mesh of the metal wire net 36 is made to a size, for example about 1mm, sufficient to prevent leakage of the electric wave.

The fan unit 13 comprises a box like metal casing 63 having openings 60 and 61 confronting lefthand openings 32 and 37 of the magnetron oscillator unit 11 and the source unit 12, respectively. A fan 64 is contained in the casing 63 at a point intermediate of the openings 60 and 61 and driven by an electric motor 65 mounted on the outside of the metal casing 63. Air is sucked into the fan or blower 64 through the metal wire net 51 of the source unit 12 through various components of the source circuit, and through openings 37 and 61. The air is then sent into the magnetron oscillator unit 11 through openings 60 and 32 to cool the magnetron oscillator unit 11. Connecting lugs 66 and 67 are secured to the magnetron oscillator unit 11 and the source unit 12 for interconnecting them through screws or bolts 68. Similar lugs 69, 70 and 71, 72 are provided for interconnecting the fan unit 13 and the source unit 12, and the fan unit 13 and the magnetron oscillator unit 11 by screws 73 and 74 respectively. An electric cord 75 is provided for connecting the source unit 12 to a source of supply, not shown.

When an AC power is supplied through cord 75, the voltage is boosted by transformer 45 and the boosted voltage is rectified into a high DC voltage of about 4KV which is applied across the anode and cathode electrodes of the magnetron as will be described later in detail. The transformer 45 also supplies a filament current of about 15 A to the filament of the magnetron. Accordingly, the magnetron oscillator unit 11 generates a microwave at antenna 25.

Figure 2:
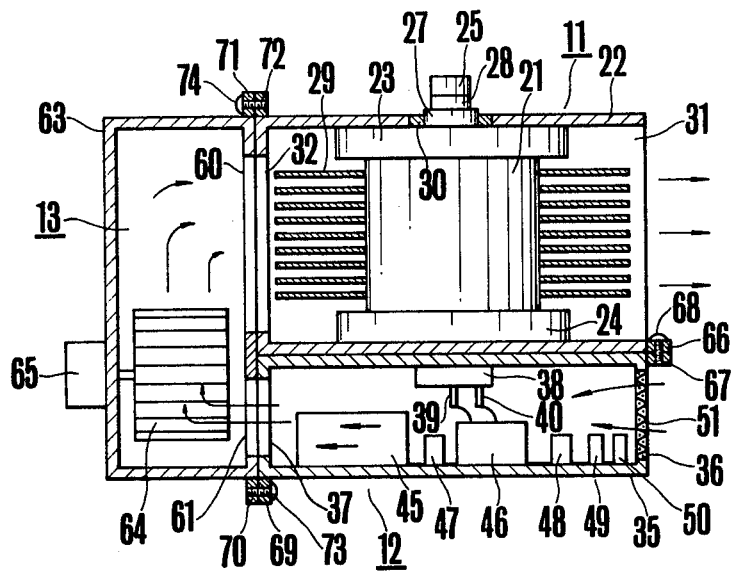
FIG. 2 is a longitudinal sectional view of the magnetron apparatus shown in FIG. 1.

Further, motor 65 is energized to drive fan 64 to circulate outside cold air through metal wire net 51, source unit 12, fan unit 13 and magnetron oscillator unit 11 as shown by arrows in FIG. 2 to cool the component elements of the source circuit and the magnetron oscillator unit 11.

With this construction since all component elements required to operate the magnetron oscillator are combined into an integral assembly, it is possible to give considerable versatility to the characteristics of the component elements so long as contemplated overall characteristics can be provided for the magnetron apparatus, thus enabling to manufacture a magnetron oscillator that can fulfil the specification of the apparatus maker. For example, when the output of the standard magnetron oscillator is smaller than that requested by the apparatus maker, the magnetomotive force of the magnets 23 and 24 is increased by increasing the magnetizing current thus increasing the output of the magnetron oscillator. Conversely, when the output of the standard magnetron oscillator is larger than that requested by the apparatus maker the magnetizing current is decreased. As a consequence, no strict condition is imposed either on the magnetron maker or the apparatus maker thereby decreasing the cost of the magnetron apparatus.

According to the construction described above, since all component elements necessary to operate the magnetron oscillator are combined into a unitary assembly it is possible to decrease the space occupied by the magnetron apparatus than in the prior art case in which the source circuit and the blower are manufactured by the apparatus maker. Moreover, as the number of the component elements is smaller than the prior art apparatus, it is possible to reduce the size, weight and cost of the magnetron apparatus.

Since all component elements are contained in three units, the number of steps of assembling and wiring is greatly reduced than the prior art apparatus. With the apparatus of this invention, it is possible to produce a microwave output by connecting the cord 75 to the source. The construction of this invention decreases the assembling and wiring operations of the apparatus maker.

Further, with this construction, the filament terminals 39 and 40 of the magnetron projecting into the interior of the source unit 12 are completely shielded by the wire metal net 51 so as to prevent leakage of the electric wave. Since all elements of the source circuit are contained in the source unit 12 the shield against leakage of microwave is more perfect than the prior art construction. The shielding of the microwave is improved further by filter circuit 46.

This construction makes it easy to match the characteristic of the fan unit 13 with that of the magnetron oscillator unit 11. Since the fan unit 13 circulates cooling air not only through the magnetron oscillator unit but also through the source unit all elements are cooled efficiently.

With this construction three units 11, 12 and 13 can be readily assembled and disassembled by screws or bolts. Each of the units can be repaired and tested in a separated condition thus simplifying repair.

The feature of this invention also lies in the source circuit to be described hereunder.

FIG. 3 shows one example of the source circuit 80 utilized to energize the magnetron oscillator unit 11. In FIG. 3, input terminals 80 and 81 of cord 75 are connected across the input terminals of a diode bridge circuit 47. The DC output of the diode bridge circuit 47 is applied to a capacitor 83 having a relatively large capacity and the smoothed DC is applied to an inverter 84 comprising switching elements 49 and 50 and a transformer 45. One of the ends of the switching elements 49 and 50 are connected to the opposite terminals of the primary winding and the other terminals of the switching elements are connected to one terminal of the capacitor 83. The intermediate terminal of the primary winding 45a is connected to the other terminal of capacitor 83. The output of the inverter 84 is derived out from the secondary winding 45b and applied across a diode bridge circuit 48.

The construction and operation of the inverter are well known in the art but one example is illustrated in FIG. 4. The inverter shown in FIG. 4 is of the self-exitation type and utilizes two PNP transistors 85 and 86 as the switching elements with their base electrodes commonly connected. One of the terminals of the feed back windings 89 and 90 are connected to the emitter electrodes of the transistors 85 and 86 and the other terminals are connected to the base electrodes via resistors 87 and 88 respectively. Since this type of inverter is well known its description is believed unnecessary. It will be sufficient only to mention that by the ON/OFF control of the transistors 85 and 86 an AC output having a square waveform is induced in the secondary winding 45b. It will be clear that the PNP transistors can be substituted by silicon controlled rectifiers or other three terminal semiconductor switching elements, and that any one of well known inverters may be used such, for example, as described in Thomas G. Wilson et al paper of the title "Self-Oscillating Transistor Parallel Inverters", I.E.E.E. Transactions on Aerospace and Electronic Systems, Vol. AES-11, No. 2, March, 1975, pp 238-243.

A secondary winding 45c of the transformer 45 shown in FIGS. 3 and 4 is connected to the filament terminals 39 and 40 of the magnetron oscillator 11 via a filter circuit 46 comprising series reactors 92 and 93 and shunt capacitors 94 and 95. The DC output of the diode bridge circuit 48 is connected across the anode and cathode electrodes of the magnetron. In this example, the anode electrode is grounded.

By the ON/OFF control of the switching elements 49 and 50 at a frequency of several hundred to several tens KHz, a high AC voltage is produced on the secondary side of transformer 45 for operating the magnetron oscillator. Since transformer 45 is used to step up the high frequency square waves formed by the switching elements 49 and 50, its size can be reduced than in the case of stepping up AC of commercial frequency of 50 or 60 Hz. When the core of the transformer is made of ferrite, its weight and heat generation can be reduced. This contributes to the reduction of the size and cost of the magnetron apparatus.

Thus, by using an inverter comprising switching elements and a transformer for stepping up the voltage of pulsating current formed by the ON/OFF control of the switching elements, the weight of the source circuit can be reduced.

The relative arrangement of the magnetron oscillator unit 11, the source unit 12 and the fan unit 13 is not limited to that shown in FIG. 1. For example, the source unit 12 and the fan unit 13 may be interchanged.

Figure 5:
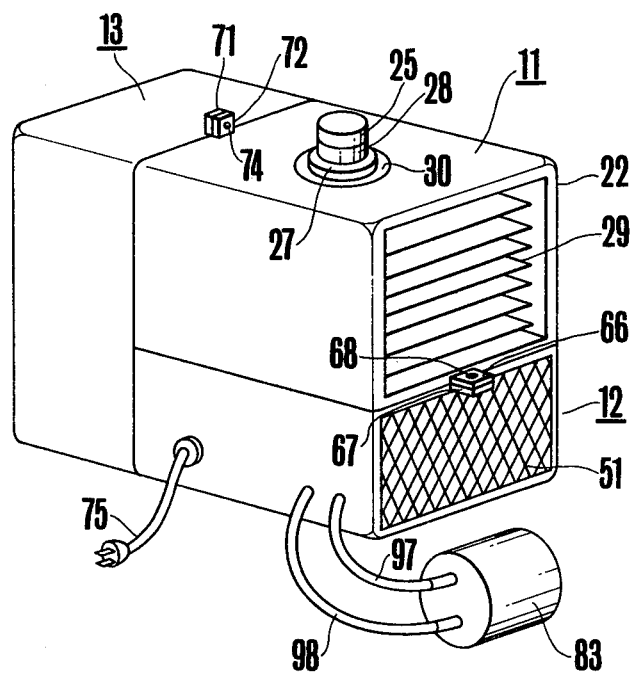
FIG. 5 is a perspective general view showing another embodiment of this invention.

FIG. 5 shows a modified embodiment of this invention which can further reduce the size of the magnetron apparatus, in which elements corresponding to those shown in FIG. 1 are designated by the same reference numerals. In this embodiment, capacitor 83 is located outside of the source unit 12 and connected therewith through conductors 97 and 98. Since the capacitor 83 is used to smooth out the wave it comprises an electrolytic capacitor having a relatively large capacitance. For this reason, if this capacitor is housed in the source unit 12 as shown in FIG. 2, the size of the source unit will increases because the capacitor occupies a substantial space in the source unit and determines the size thereof. By locating the capacitor on the outside of the source unit 12, its size can be reduced greatly. In as much as this capacitor is connected on the primary side of the transformer, no microwave is radiated from conductors 97 and 98. Such capacitor may be mounted at any position of the utilization device, for example a microwave oven, energized by the magnetron oscillator. When disposed at a position of high cooling efficiency, the cooling of the capacitor is improved.

Figure 6:
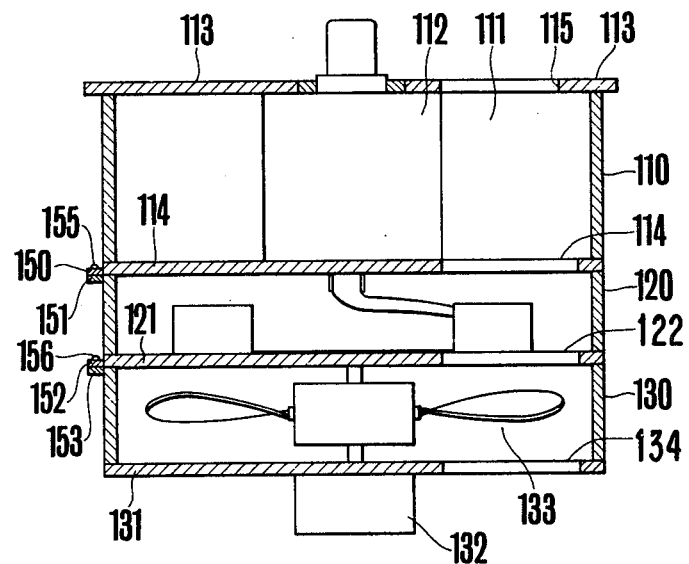
FIG. 6 is a longitudinal sectional view showing still another embodiment of this invention and FIG. 7 is a plan view of one half of the embodiment shown in FIG. 6.
Figure 7:
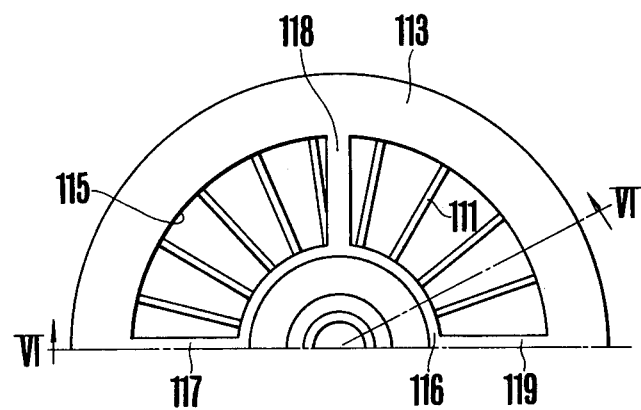

FIGS. 6 and 7 show still another embodiment of this invention wherein a magnetron oscillator unit 110, a source unit 120 and a fan unit 130 are superposed one upon the other. In this embodiment, the cooling fins 111 of the magnetron 112 extend radially at equal spacing as shown in FIG. 7. The end plates 113, 114, 121 and 131 of respective units are provided with openings 115, 114, 122 and 134 for circulating cooling air forced by a fan 133 which is driven by a motor 132. As shown in FIG. 7, plate 131 is provided with an annular opening 115 and a plurality of spokes 117, 118 and 119 interconnect the peripheral or rim portion of the plate 113 and the central portion 116 thereof. Respective units are connected together by lugs 150, 151, 152 and 154 and screws 155 and 156 in the same manner as in FIGS. 1 and 2.

In the construction shown in FIGS. 1 and 2 instead of forming an end opening 36, the metal casing 35 may be provided with a plurality of small perforations of a size not to leak the microwave. Further, in the construction shown in FIG. 5, instead of capacitor 83, other large size element may be located on the outside of the source unit. It will also be clear that instead of using an inverter as in FIG. 3 a conventional combination of a step-up transformer and a high voltage rectifier may be used for operating the magnetron osicllator. Further, the magnetron may be of the outer magnet type or the inner magnet type.

Thus, it will be clear that many changes and modifications will readily occur to one skilled in the art without departing the true spirit and scope of the invention as defined in the appended claims.

What is claimed is:

1. Magnetron apparatus comprising a magnetron oscillator unit for generating microwave power, a source unit containing a power source unit for operating said magnetron oscillator unit, a fan unit for circulating cooling air through said magnetron oscillator unit and said source unit, said magnetron unit, power source unit, and fan unit each being contained in a different metal casing, each casing having walls and at least two openings in its walls to provide an air passage through each casing, and means for connecting together the casings into an integral assembly, one air passage opening of a casing being coincident with one air passage opening of a different casing to which it is connected by said connecting means to form an air passage through said connected magnetron, power source, and fan casings having an air inlet opening provided by an opening in a wall of one casing and an air outlet opening provided by an opening in a wall of different casing.

2. The magnetron apparatus according to claim 1 wherein said source unit comprises a metal casing into which filament terminals of said magnetron oscillator unit project, said source casing having opposite side openings, the magnetron oscillator unit having opposite side openings in its casing and having a plurality of cooling fins extending in the direction of its casing openings and also perpendicular to the axis of said magnetron oscillator unit, and wherein said fan unit comprises a casing having openings at the opposite ends of one wall of its casing, one fan casing opening facing one of the side openings of the source unit and the other fan casing opening facing one of the side openings of said magnetron oscillator unit casing for circulating the cooling air through said cooling fins.

3. The magnetron apparatus according to claim 2 wherein said magnetron oscillator unit casing is mounted on said source unit casing by a wall of each having no opening to form a sub-assembly, and said fan unit casing is connected to one side of the sub-assembly of said magnetron oscillator unit and said source unit with coincident openings in the casings.

4. The magnetron apparatus according to claim 3 wherein the side opening of said metal casing of the source unit on the side opposite said fan unit casing is provided with a metal wire net for preventing the leakage of microwave energy.

5. The magnetron apparatus according to claim 2 wherein the metal casing of the source unit contains all elements of the source circuit and provided with a cord adapted to be connected with a source of supply.

6. The magnetron apparatus according to claim 1 wherein said source circuit comprises an inverter.

7. The magnetron apparatus according to claim 5 wherein said source circuit comprises a rectifier circuit for rectifying an AC input, a capacitor for smoothing the DC output of said rectifier circuit, and said inverter converts the smoothed DC output into high voltage high frequency output for operating the magnetron oscillator unit.

8. The magnetron apparatus according to claim 7 wherein one portion of the high frequency output is supplied to the filament of the magnetron oscillator and the other portion is applied to the anode electrode of the magnetron oscillator through a rectifier.

9. The magnetron apparatus according to claim 7 wherein said inverter comprises a pair of alternately ON/OFF controlled semiconductor switching elements and a transformer for boosting up the voltage of the DC current interrupted by said switching elements.

10. The magnetron apparatus according to claim 1 wherein said source unit comprises a metal casing for receiving filament terminals of the magnetron oscillator unit protruding into said casing and a filter circuit, and said metal casing air passage opening comprises a plurality of perforations of a size not to leak the microwave, said perforations acting as a portion of the air circulation passage.

11. The magnetron apparatus according to claim 1 wherein said source unit comprises a metal casing containing the elements of the source circuit, one element thereof having a large size being positioned to the outside of said metal casing.

12. The magnetron apparatus according to claim 1 wherein said magnetron oscillator unit, said source unit and said fan unit are removably interconnected.

13. The magnetron apparatus according to claim 1 wherein said magnetron oscillator unit, said source unit and said fan unit casings are superposed one upon the other in the order mentioned along the axis of a magnetron.

14. The magnetron apparatus according to claim 13 wherein said magnetron is provided with a plurality of radially extending cooling fins.

15. The magnetron apparatus of claim 3 wherein the magnetron unit casing comprises a magnetron yoke for said magnetron unit in the form of a cubic box with opposing-side openings to allow air flow through the yoke and over the magnetron unit within the yoke.

* * * * *